United States Patent
Hwang

(10) Patent No.: US 11,258,309 B2
(45) Date of Patent: Feb. 22, 2022

(54) WIRELESS POWER TRANSMISSION DEVICE

(71) Applicant: AMOSENSE CO., LTD, Cheonan-si (KR)

(72) Inventor: Seung Jae Hwang, Incheon (KR)

(73) Assignee: AMOSENSE CO., LTD, Cheonan-si (KR)

( * ) Notice: Subject to any disclaimer, the term of this patent is extended or adjusted under 35 U.S.C. 154(b) by 0 days.

(21) Appl. No.: 16/640,193

(22) PCT Filed: Sep. 12, 2018

(86) PCT No.: PCT/KR2018/010682
§ 371 (c)(1),
(2) Date: Feb. 19, 2020

(87) PCT Pub. No.: WO2019/054747
PCT Pub. Date: Mar. 21, 2019

(65) Prior Publication Data
US 2020/0212726 A1 Jul. 2, 2020

(30) Foreign Application Priority Data

Sep. 14, 2017 (KR) .......................... 10-2017-0117739

(51) Int. Cl.
*H02J 50/70* (2016.01)
*H02J 50/20* (2016.01)
(Continued)

(52) U.S. Cl.
CPC .......... *H02J 50/70* (2016.02); *H01F 27/2871* (2013.01); *H01F 27/36* (2013.01);
(Continued)

(58) Field of Classification Search
CPC .. H02J 50/70; H02J 50/80; H02J 50/27; H02J 50/12; H02J 50/10; H02J 7/0042;
(Continued)

(56) References Cited

U.S. PATENT DOCUMENTS

2005/0041370 A1* 2/2005 Wilk ...................... H01G 9/008
361/502
2013/0015718 A1* 1/2013 Jung .................... H04B 5/0087
307/104
(Continued)

FOREIGN PATENT DOCUMENTS

JP 2003037861 2/2003
JP 2010245323 10/2010
(Continued)

OTHER PUBLICATIONS

International Search Report—PCT/KR2018/010682 dated Mar. 21, 2019.
(Continued)

*Primary Examiner* — Lincoln D Donovan
*Assistant Examiner* — Alex W Lam
(74) *Attorney, Agent, or Firm* — Cantor Colburn LLP

(57) ABSTRACT

Provided is a wireless power transmission device. A wireless power transmission device includes: at least one antenna for wireless power transmission disposed on one side of a magnetic shielding sheet; a support plate having at least one receiving groove formed therein for receiving the antenna for wireless power transmission; and an antenna for wireless communication disposed along a side portion of the support plate.

8 Claims, 12 Drawing Sheets

(51) Int. Cl.
  *H02J 50/40* (2016.01)
  *H01F 27/28* (2006.01)
  *H01F 38/14* (2006.01)
  *H02J 7/02* (2016.01)
  *H04B 5/00* (2006.01)
  *H01F 27/36* (2006.01)
  *H05K 5/03* (2006.01)
  *H05K 7/20* (2006.01)
  *H05K 9/00* (2006.01)

(52) U.S. Cl.
  CPC ............... *H01F 38/14* (2013.01); *H02J 7/02* (2013.01); *H02J 50/20* (2016.02); *H02J 50/40* (2016.02); *H04B 5/0037* (2013.01); *H05K 5/03* (2013.01); *H05K 7/209* (2013.01); *H05K 9/006* (2013.01); *H05K 9/0075* (2013.01)

(58) Field of Classification Search
  CPC .... H02J 50/20; H02J 50/40; H02J 7/02; H02J 50/005; H04B 5/00; H04B 5/0037; H05K 7/2039; H05K 9/0081; H05K 5/03; H05K 7/209; H05K 9/006; H05K 9/0075; H01F 27/288; H01F 27/28; H01F 27/22; H01F 27/36; H01F 27/2871; H01F 38/14; H01F 27/40; H01F 27/38; H01F 27/025; H01F 27/366; Y02T 90/14; Y02T 10/70; Y02T 10/7072
  See application file for complete search history.

(56) References Cited

U.S. PATENT DOCUMENTS

| | | | |
|---|---|---|---|
| 2013/0038278 A1 | 2/2013 | Park et al. | |
| 2013/0106198 A1* | 5/2013 | Kuk | H02J 7/0029 307/104 |
| 2014/0265612 A1* | 9/2014 | Choi | H01F 38/14 307/104 |
| 2015/0349406 A1* | 12/2015 | Jung | H01Q 7/00 343/702 |
| 2016/0072337 A1 | 3/2016 | Chang et al. | |
| 2016/0210616 A1* | 7/2016 | Lee | G06Q 20/3274 |
| 2016/0377491 A1 | 12/2016 | Ban | |
| 2018/0132376 A1 | 5/2018 | Shin et al. | |

FOREIGN PATENT DOCUMENTS

| | | |
|---|---|---|
| JP | 2012517206 | 7/2012 |
| JP | 2012235079 | 11/2012 |
| JP | 2014011852 | 1/2014 |
| JP | 3190075 | 4/2014 |
| JP | 2014155307 | 8/2014 |
| JP | 2017092809 | 5/2017 |
| JP | 2018530288 | 10/2018 |
| KR | 20130016588 | 2/2013 |
| KR | 20140094275 | 7/2014 |
| KR | 20160118911 | 10/2016 |
| KR | 101681412 | 11/2016 |
| KR | 101690500 | 12/2016 |
| KR | 101733579 | 5/2017 |
| KR | 101757204 | 7/2017 |

OTHER PUBLICATIONS

Japanese Office Action—Japanese Application No. 2020-515201 dated Apr. 13, 2021, citing JP 2014-155307, KR 10-1733579, JP 3190075, KR 10-1690500, JP 2010-245323, JP 2017-092809, JP 2012-235079, JP 2003-037861, JP 2012-517206, US 2016/0072337, JP 2018-530288, US 2018/0132376 and US 2013/0038278.

European Search Report—European Application No. 18856919.8 dated Jul. 14, 2021, citing JP 2014-155307, KR 2016-0118911, US 2016/0377491 and KR 10-1757204.

* cited by examiner

WIRELESS POWER TRANSMISSION DEVICE

CROSS-REFERENCE TO RELATED APPLICATIONS

This application is a national entry of PCT Application No. PCT/KR2018/010682 filed on Sep. 12, 2018, which claims priority to and the benefit of Korean Application No. 10-2017-0117739 filed Sep. 14, 2017, in the Korean Patent Office, the entire contents of which are incorporated herein by reference.

TECHNICAL FIELD

The present invention relates to a wireless power transfer technique, and more particularly, to a wireless power transmission device capable of performing both data communication and wireless charging.

BACKGROUND ART

Recently, in electronic devices, various functions such as wireless charging and data transmission through near-field communication (NFC) have been added. NFC is a radio-frequency identification (RFID), which is an electronic tag, which is non-contact short-range wireless communication technology that uses a frequency band of 13.56 MHz and allows data to be transmitted between terminals at a close range within 10 cm.

When such short-range wireless communication technology is applied to a vehicle, various pieces of information of the vehicle may be transmitted to a portable electronic device. Accordingly, a user may easily check the information of the vehicle using the portable electronic device.

Therefore, a wireless power transmission device for a vehicle applied to the vehicle needs to be implemented so that a short-range wireless communication function may smoothly operate together with an intrinsic wireless charging function for charging a battery of a portable electronic device.

As one of implementation methods, a method of arranging a circuit board on which an NFC antenna for short-range wireless communication is patterned on an upper side of a transmission coil for wireless power transmission has been proposed.

The wireless power transmission device for a vehicle of the above method may perform both a wireless charging function and a short-range wireless communication function. However, since the circuit board on which the NFC antenna is formed is separately stacked on the upper side of the transmission coil, a total thickness of the wireless power transmission device for a vehicle may be increased by a thickness of the circuit board. Accordingly, when charging the battery of the portable electronic device, there is a limit that a distance between the transmission coil and a reception coil embedded in the electronic device may be increased due to the thickness of the circuit board. As a result, the transmission coil has a problem in that charging efficiency is degraded.

DISCLOSURE

Technical Problem

The present invention is directed to providing a wireless power transmission device capable of smoothly performing both a data communication function and a wireless charging function while preventing wireless charging efficiency from being degraded.

Technical Solution

One aspect of the present invention provides a wireless power transmission device including at least one antenna for wireless power transmission disposed on one surface of a magnetic field shielding sheet, a heat dissipation housing in which at least one circuit board is embedded and which emits heat generated from a heat source, a cover coupled to the heat dissipation housing to cover the at least one antenna for wireless power transmission, and an antenna for wireless communication formed integrally with the cover.

The antenna for wireless communication may be embedded in an inner surface of the cover.

The antenna for wireless communication may be disposed so as not to overlap the antenna for wireless power transmission.

The antenna for wireless communication may be a laser direct structuring (LDS) antenna formed on one surface of the cover.

The cover may be made of a heat dissipation plastic material having heat dissipating properties.

The wireless power transmission device may further include a plate type heat dissipation plate disposed on one surface of the magnetic field shielding sheet. For example, the heat dissipation plate may be any one of a plate type copper plate, aluminum plate, and graphite sheet.

The wireless power transmission device may further include a support plate having at least one accommodation groove formed in each of a first surface and a second surface which are opposite to each other, and the antenna for wireless power transmission may be composed of a plurality of flat-plate type coils. In this case, any one of the plurality of flat-plate type coils may be disposed in a first accommodation groove formed in the first surface, and the other one may be disposed in a second accommodation groove formed in the second surface.

The support plate may be made of a plastic material having heat dissipating properties.

Another aspect of the present invention provides a wireless power transmission device including at least one antenna for wireless power transmission disposed on one surface of a magnetic field shielding sheet, a support plate having at least one accommodation groove for accommodating the antenna for wireless power transmission, and an antenna for wireless communication disposed along a side portion of the support plate.

The support plate may include an arrangement groove which is formed inwardly into a side portion thereof so as to accommodate the antenna for wireless communication, and the antenna for wireless communication may be a conductive member wound a predetermined number of turns around the arrangement groove.

A width of the arrangement groove may be identical to a wire diameter of the conductive member.

The support plate may include two through-holes formed to allow both ends of the antenna for wireless communication to pass therethrough.

Any one of the two through-holes may be formed to be relatively located at an inner side of the support plate. In this case, the two through-holes may be formed at locations in communication with the arrangement groove.

The wireless power transmission device may further include a plate type heat dissipation plate disposed on one surface of the magnetic field shielding sheet, the heat dissipation plate may include a cut portion formed inwardly into one side thereof to have a predetermined area, and a circuit board, which is electrically connected to the antenna for wireless power transmission and the antenna for wireless communication, may be disposed on the cut portion.

The wireless power transmission device may include at least one temperature sensor mounted on one surface of the circuit board, and the magnetic field shielding sheet may include a through-hole formed to pass therethrough in a region corresponding to the temperature sensor.

Advantageous Effects

According to the present invention, by optimizing an arrangement location of an antenna for wireless communication, both data communication and wireless charging can be smoothly performed while preventing wireless charging efficiency from being degraded.

Further, in the present invention, by using a support plate, a plurality of flat-plate type coils can be placed in accordance with certification standards, thereby increasing assembling productivity, and by using a heat dissipation plate, in addition to improving heat dissipation performance, assembling and fastening with other parts can be improved.

MODES OF THE INVENTION

Figure 1:
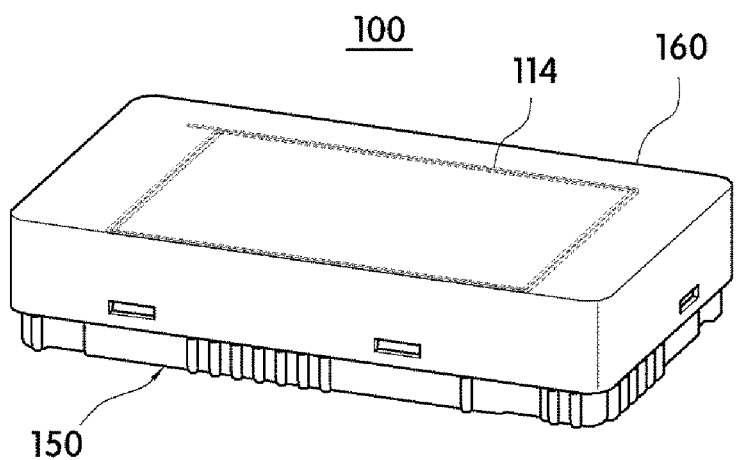
FIG. 1 is a view illustrating a wireless power transmission device according to one embodiment of the present invention.

Hereinafter, embodiments of the present invention will be described in detail with reference to the accompanying drawings so that those skilled in the art may easily implement the present invention. The present invention may be implemented in several different forms and is not limited to embodiments described herein. In addition, parts irrelevant to description are omitted in the drawings in order to clearly explain the present invention. Similar parts are denoted by similar reference numerals throughout this specification.

Wireless power transmission devices 100 and 200 according to embodiments of the present invention may be provided or installed in vehicles. When electronic devices such as smartphones are disposed on an upper side of the wireless power transmission devices 100 and 200, the wireless power transmission devices 100 and 200 may transmit wireless power to the electronic devices through antennas 111, 112, and 113 for wireless power transmission. Accordingly, the electronic devices may receive the wireless power through wireless power reception module embedded therein, thereby charging batteries thereof. In the present invention, the electronic devices may be portable electronic devices such as mobile phones, personal digital assistants (PDAs), portable media players (PMPs), tablet computers, multimedia devices, and the like.

Figure 8:
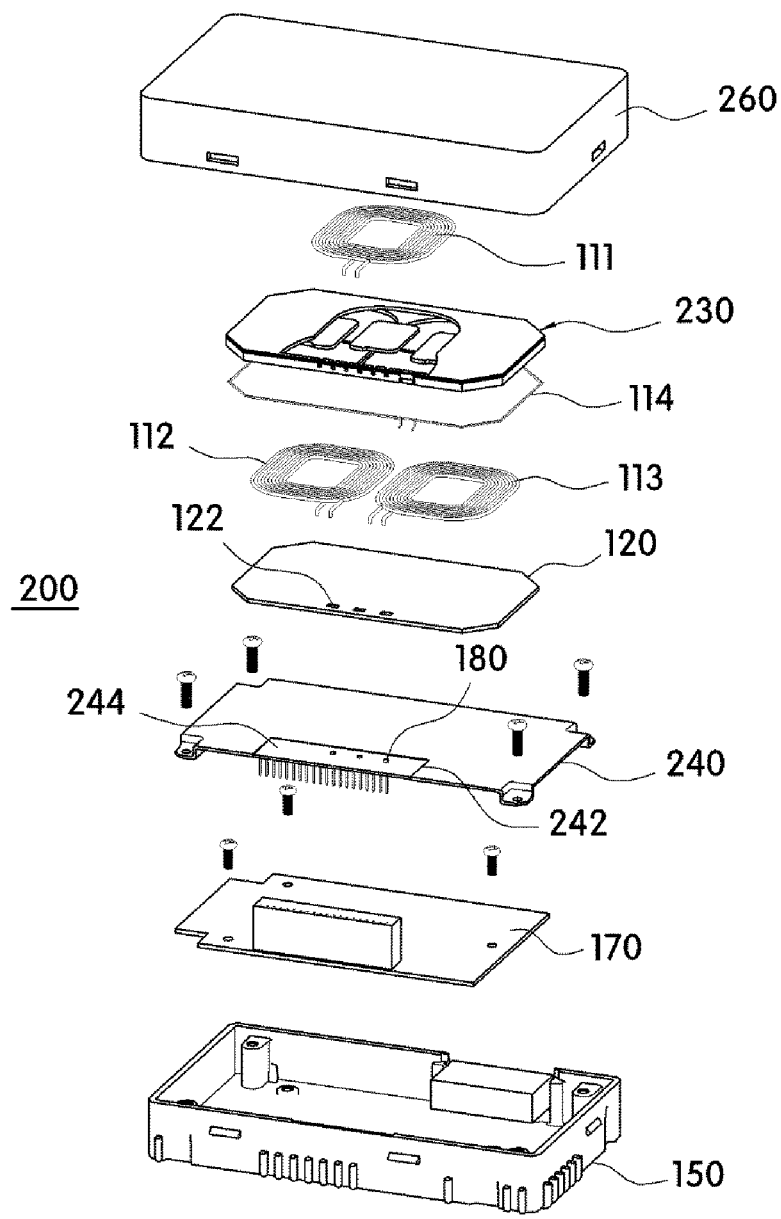
FIG. 8 is an exploded view of FIG. 6.

In this case, each of the wireless power transmission devices 100 and 200 according to the embodiments of the present invention may include an antenna 114 for wireless communication for transmitting or receiving data with the electronic device when the electronic device is close thereto as illustrated in FIGS. 1 and 8.

Accordingly, the wireless power transmission devices 100 and 200 according to the embodiments of the present invention may perform data transmission and reception using the antenna 114 for wireless communication together with wireless power transmission using the antennas 111, 112, and 113 for wireless power transmission.

For example, when an electronic device is disposed at a location corresponding to the antennas 111, 112, and 113 for wireless power transmission, each of the wireless power transmission devices 100 and 200 may separately or integrally perform wireless charging using the antennas 111, 112, and 113 for wireless power transmission and data communication using the antenna 114 for wireless communication.

In the present invention, the antenna 114 for wireless communication may transmit various pieces of information of the vehicle to the electronic device or receive a control signal input to the electronic device through wireless communication. Accordingly, the various pieces of information of the vehicle may be displayed through the electronic device, and the vehicle may operate functions, such as on/off of power and locking/unlocking of doors in response to the control signal received from the electronic device.

In this case, the wireless power transmission devices 100 and 200 according to the embodiments of the present invention may prevent an increase in a distance between the antennas 111, 112, and 113 for wireless power transmission and an antenna for wireless power reception embedded in the electronic device during wireless charging, and thus may prevent degradation of wireless charging efficiency due to the increase in the distance.

To this end, the wireless power transmission device 100 according to the embodiment of the present invention may include antennas 111, 112, and 113 for wireless power transmission, a housing 150, a cover 160, and an antenna 114 for wireless communication as illustrated in FIGS. 1 to 5. The antenna 114 for wireless communication may be integrally formed with the cover 160.

The antennas 111, 112, and 113 for wireless power transmission may transmit wireless power to a wireless power reception module using an inductive coupling method based on an electromagnetic induction phenomenon, or a magnetic resonance method.

For example, the antennas 111, 112, and 113 for wireless power transmission may be antennas of the Wireless Power Consortium (Qi) standard or the Power Matters Alliance (PMA) standard, which operate in a magnetic induction method in a frequency band of 100 to 350 kHz, may be antennas of the Alliance For Wireless Power (A4WP) standard, which operate in a magnetic resonance method in a frequency band of 6.78 MHz, or may be antennas in which at least two or more of a Qi standard, a PMA standard, and an A4WP standard are combined with each other.

The antennas 111, 112, and 113 for wireless power transmission may be flat-plate type coils having a shape of any one of circular, elliptical, and rectangular shapes in which a conductive member having a predetermined length is wound a plurality of times in a clockwise or counterclockwise direction.

Figure 13:
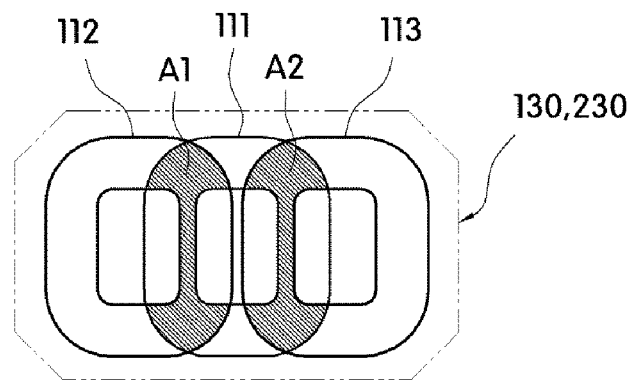
FIG. 13 is a conceptual view for describing an arrangement relationship between antennas for wireless power transmission which are inserted into accommodation grooves of a support plate in a wireless power transmission device according to the present invention.

In this case, the antennas 111, 112, and 113 for wireless power transmission may be provided as a plurality of antennas, and at least some of the plurality of the antennas may be stacked to overlap each other. Specifically, the antennas 111, 112, and 113 for wireless power transmission may be composed of three flat-plate type coils as illustrated in FIGS. 1 and 13. Any one flat-plate type coil 111 of the three flat-plate type coils may be stacked on one surfaces of the other two flat-plate type coils 112 and 113, and a portion of the flat-plate type coil 111 may be disposed to overlap the other two flat-plate type coils 112 and 113.

Hereinafter, for convenience of description, two flat-plate type coils disposed on the same plane are referred to as a second coil 112 and a third coil 113, and a flat-plate type coil stacked on one surfaces of the second coil 112 and the third coil 113 is referred to as a first coil 111.

However, the present invention is not limited to arrangement relationship, and a top and bottom arrangement relationship of the first coil 111, the second coil 112, and the third coil 113 and a total number of flat-plate type coils may be variously changed.

In this case, in the wireless power transmission device 100 according to the embodiment of the present invention, in a case in which the antennas 111, 112, and 113 for wireless power transmission may be composed of a plurality of flat-plate type coils and at least one flat-plate type coil is stacked on the other flat-plate type coils, the wireless power transmission device 100 may further include a support plate 130 for fixing locations of the flat-plate type coils 111, 112, and 113.

That is, in a case in which some of the plurality of flat-plate type coils 111, 112, and 113 are disposed to overlap each other, the support plate 130 may guide overlapping portions between the coils so as to overlap at desired locations and to have desired areas.

To this end, the support plate 130 may be a plate type member having a first surface 130a and a second surface 130b which are opposite to each other as illustrated in FIGS. 4A and 4B. The support plate 130 may include a plurality of accommodation grooves 131 and 132 for accommodating the flat-plate type coils.

For example, the number of the accommodation grooves 131 and 132 formed may correspond to the number of the plurality of coils, and the accommodation grooves 131 and 132 may include a first accommodation groove 131 for accommodating the first coil 111 disposed on an upper portion thereof and two second accommodation grooves 132 for respectively accommodating the second coil 112 and the third coil 113 disposed on the same plane.

In this case, the first accommodation groove 131 and second accommodation grooves 132 may be formed on the first surface 130a and the second surface 130b, respectively, which are opposite to each other. That is, the first accommodation groove 131 may be formed in the first surface 130a of the support plate 130, and the second accommodation grooves 132 may be formed in the second surface 130b of the support plate 130. In addition, the first accommodation groove 131 and the second accommodation grooves 132 may be formed in the first surface 130a and the second surface 130b, respectively, so as to have overlapping portions S1 and S2 in which at least some portions overlap each other.

Figure 14:
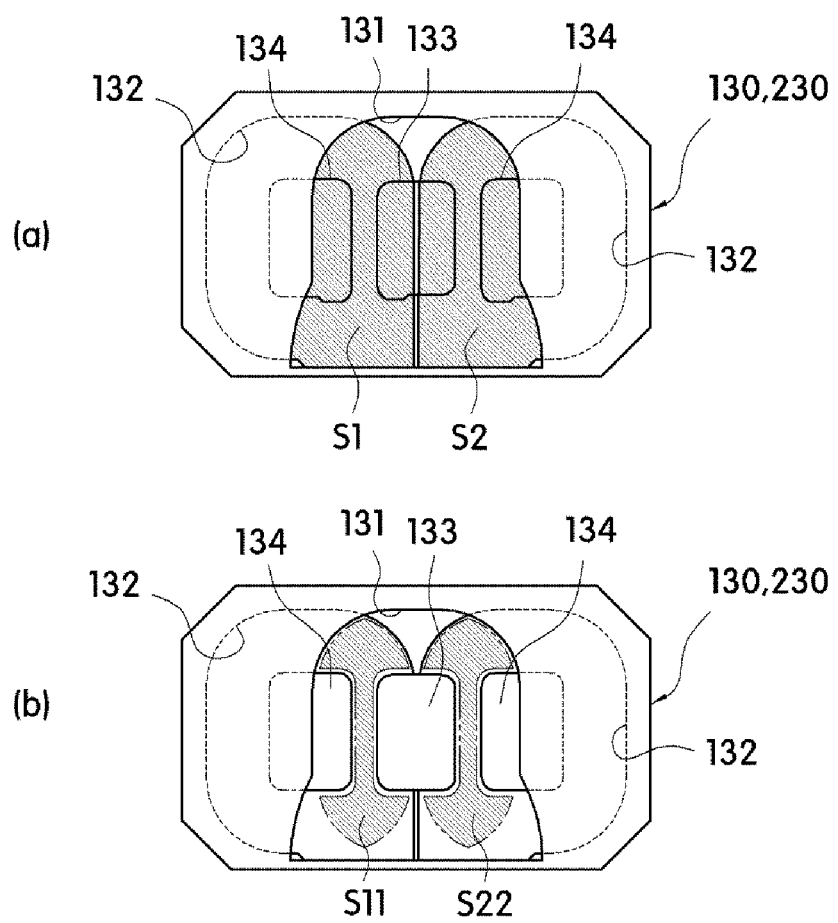
FIG. 14 illustrates conceptual views for describing overlapping portions of the antennas for wireless power transmission and the accommodation grooves in FIG. 13.

Accordingly, as illustrated in in FIGS. 14A and 14B, when an operator inserts the first coil 111 into the first accommodation groove 131 and inserts the second coil 112 and the third coil 113 into the second accommodation grooves 132, respectively, the first coil 111 may overlap each of the second coil 112 and the third coil 113 at locations corresponding to some portions S11 and S12 among the overlapping portions S1 and S2.

In this case, some portions of the overlapping portions S1 and S2 may be formed to pass through the support plate 130. As a result, a portion of the first coil 111 inserted into the first accommodation groove 121 may be in direct contact with some portions of the second coil 112 and the third coil 113 which are inserted into the second accommodation grooves 132.

As a result, in the process of forming the first accommodation groove 131 and the second accommodation grooves 132, when the overlapping areas overlap each other are formed to have a location and area so as to meet the required specification, the alignment between the coils may be completed easily without a need for a separate alignment.

Further, the first accommodation groove 131 and the second accommodation grooves 132 may include ridge portions 133 and 134 which protrude from the accommodation grooves 131 and 132 by a predetermined height at central portions thereof, and the ridge portions 133 and 134 may be formed at locations corresponding to empty spaces of central portions of the coils 111, 112, and 113.

For example, as illustrated in in FIGS. 4A and 4B, the ridge portions may include a first ridge portion 133, which protrudes from a bottom surface of the first accommodation groove 121 by a predetermined height at the central portion of the first accommodation groove 131, and second ridge portions 134, which protrude from bottom surfaces of the second accommodation grooves 132 by a predetermined height at the central portions of the second accommodation grooves 132.

When the coils 111, 112, and 113 are inserted into the accommodation grooves 131 and 132, the ridge portions 133 and 134 may be located in empty spaces of central portions of the inserted coils 111, 112, and 113 and may be in contact with inner sides of the coils 111, 112, and 113. Accordingly, the inner sides of the coils inserted into the respective accommodation grooves 131 and 132 may be supported by the ridge portions 133 and 134, respectively, and outer sides of the coils may be supported by inner walls of the accommodation grooves 131 and 132.

As a result, even when the shaking of the wireless power transmission device 100 occurs, for example, the shaking occurs when the vehicle is driven, the locations of the first coil 111, the second coil 112, and the third coil 113 may be fixed by the respective accommodation grooves 131 and 132. Accordingly, the movement of the first coil 111, the second coil 112, and the third coil 113 may be prevented even when the shaking of the vehicle occurs.

In this case, the ridge portions 133 and 134 may be provided to have an area corresponding to that of the empty space of the central portions of the coils. Accordingly, some of the ridge portions 133 and 134 may be disposed on the overlapping portions S1 and S2 in which the first accommodation groove 131 and the second accommodation grooves 132 overlap each other, and the other portions thereof may be disposed in regions in which the first accommodation groove 131 and the second accommodation grooves 132 do not overlap each other.

As a result, some portions of the first ridge portion 133 formed in the first accommodation groove 131, which are disposed in the overlapping portions S1 and S2, may support some portions of the coils 112 and 113 inserted into the second accommodation grooves 132. Further, some portions of the second ridge portion 134 formed in the second accommodation grooves 132, which are disposed in the overlapping portions S1 and S2, may support a portion of the coil 111 inserted into the first accommodation groove 131.

Here, the first accommodation groove 131 and the second accommodation grooves 132 may be formed to have the same depth as thicknesses of the coils 111, 112, and 113, and the support plate 130 may have a thickness which is identical to a sum of thicknesses of the two coils (111 and 112) and (111 and 113) stacked on each other. For example, a maximum thickness of the support plate 130 may be identical to a sum of the thickness of the first coil 111 and the thickness of the second coil 112.

Accordingly, even when the wireless power transmission device 100 according to the embodiment of the present invention includes the support plate 130 for aligning the locations of the coils, a total thickness of the wireless power transmission device 100 may not be increased, and the locations of the plurality of coils 111, 112, and 113 may be easily aligned using the support plate 130.

In addition, each of the coils 111, 112, and 113 accommodated in the accommodation grooves 131 and 132 may have one surface that forms a horizontal surface with one surface of the support plate 130, and thus a contact area with a magnetic field shielding sheet 120 may be increased. Accordingly, even when the magnetic field shielding sheet 120 is made of a material having flexibility or a material that has strong brittleness, an edge of the magnetic field shielding sheet 120 may be supported by the support plate 130. As a result, the magnetic field shielding sheet 120 may be prevented from being damaged by an external impact through the support plate 130 and may be disposed horizontally on one surface of the support plate 130.

Meanwhile, the support plate 130 may serve to dispose the coils in an easily aligned state and to fix the locations of the coils and may include a heat dissipation function to address a thermal problem by rapidly dispersing heat generated from the coils.

In this case, since all the other portions of the coils inserted into the accommodation grooves 131 and 132 except for the overlapping portions A1 and A2 are in direct contact with the support plate 130, the contact areas between the support plate 130 and the coils may be maximally secured. Accordingly, the heat generated from the coils may be rapidly dispersed through the support plate 130.

To this end, a coating layer (not illustrated) having heat dissipating properties may be formed on an outer surface of the support plate 130 and the support plate 130 itself may be made of a plastic material having heat dissipating properties. In addition, the support plate 130 may be made of a plastic material having heat dissipating properties and a coating layer having heat dissipating properties may be formed on the outer surface of the support plate 130.

As a non-limiting example, the coating layer may include a thermally conductive filler such as a carbon-based filler, and graphene, carbon nanotubes, bronze nitride, and the like may be used as the coating layer. In addition, a composite plastic or the like including plate type graphite may be used as the plastic material having heat dissipating properties. However, the material of the coating layer and/or the heat-dissipation plastic material for heat dissipation is not limited thereto, and any known coating materials and heat-dissipation plastic material used for heat dissipation may be used.

The magnetic field shielding sheet 120 may be made of a plate type member having a predetermined area. The antennas 111, 112, and 113 for wireless power transmission may be disposed on one surface of the magnetic field shielding sheet 120.

In this case, the magnetic field shielding sheet 120 may shield a magnetic field generated by a radio signal and increase a focusing degree of the magnetic field in a required direction.

To this end, the magnetic field shielding sheet 120 may be made of a material having magnetic properties. For example, an amorphous ribbon sheet, a ferrite sheet, a polymer sheet, or the like may be used as the magnetic field shielding sheet 120.

Here, the amorphous ribbon sheet may be a ribbon sheet including at least one of amorphous alloys and nanocrystalline alloys, the amorphous alloy may be a Fe-based or Co-based magnetic alloy, and the ferrite sheet may be a sintered ferrite sheet such as Mn—Zn ferrite or Ni—Zn ferrite.

In addition, the magnetic field shielding sheet 120 may be formed to be separated into a plurality of fine pieces by flake processing to increase the overall resistance to suppress generation of eddy current or to increase flexibility, and the plurality of fine pieces may be formed atypically.

Further, the magnetic field shielding sheet 120 may be a multi-layered sheet in which a plurality of magnetic sheets are laminated in multiple layers through an adhesive layer, the plurality of magnetic sheets may be a sheet which is separated into a plurality of fine pieces through a flake treatment, and fine pieces that are adjacent to each other may be entirely insulated or partially insulated.

Since the magnetic field shielding sheet 120 is a known configuration, a detailed description thereof will be omitted, and any known material used as the shielding sheet may be used.

In addition, the magnetic field shielding sheet 120 may have an appropriate size including a region corresponding to the antenna 114 for wireless communication so as to increase the performance of the antenna 114 for wireless communication. Accordingly, the wireless power transmission device 100 may increase both of the performance of the antenna 114 for wireless communication and the performance of the antennas 111, 112, and 113 for wireless power transmission using one magnetic field shielding sheet 120.

Meanwhile, the wireless power transmission device 100 according to the embodiment of the present invention may include the housing 150 and the cover 160 detachably coupled to the housing 150.

Specifically, the housing 150 may be provided in a housing shape having an accommodation space of which an upper portion is open, and at least one driving circuit board 170 or 171 may be accommodated in the accommodation space.

In this case, the at least one driving circuit board 170 or 171 may be electrically connected to the antennas 111, 112, and 113 for wireless power transmission and the antenna 114 for wireless communication and may control overall driving of the wireless power transmission device 100.

To this end, in the driving circuit board 170, various circuit elements for controlling the overall driving of the wireless power transmission device may be mounted and driving chips for driving the antenna 114 for wireless communication and the antennas 111, 112, and 113 for wireless power transmission may be mounted. In addition, the circuit elements may be provided as a plurality of circuit elements or may be provided in one integrated form.

The housing 150 may be made of a typical plastic material but may have heat dissipating properties so as to discharge heat generated from a heat source to the outside during driving.

For example, the housing 150 may be made of a metal material such as copper or aluminum, may be made of a heat dissipation plastic material, or may be provided in a form in which a metal plate and heat dissipation plastic are integrated. In addition, in order to implement more excellent heat dissipating properties, a heat dissipation coating layer (not illustrated) may be formed on a surface of the housing 150.

Accordingly, the heat generated from the heat source may be emitted through the housing 150. Accordingly, the cover 160 on which an electronic device, which is a charging target, is placed may have a low surface temperature.

That is, the wireless power transmission device 100 according to the embodiment of the present invention may rapidly emit the heat generated from the heat source through the housing 150 even though the cover 160 is heated by the heat generated from the heat source and thus may prevent the surface temperature of the cover 160 from increasing. Accordingly, even when the user's body comes into contact with the cover 160 during the operation of the wireless power transmission device 100, the user may not feel an unpleasant feeling due to a high temperature.

As a non-limiting example, any known coating layer having heat dissipating properties may be applied to the heat dissipation coating layer, but the heat dissipation coating layer may include a coating layer forming component, a carbon-based filler, and a property enhancing component for improving heat dissipating properties and adhesion. Further, the heat dissipation plastic may be made of a heat dissipation member forming composition including a graphite composite and a polymer resin and may be implemented in the form of the housing 150 through curing after insert injection molding.

Here, the graphite composite may be a composite in which nanometal particles are bonded to a surface of a plate type graphite, and the heat dissipation member forming composition may be a composition in which the graphite composite is dispersed in a polymer resin. In addition, although not specifically described, the cover 160 may also be made of the same material as the housing 150 described above. When the cover 160 has heat dissipating properties, the surface temperature of the cover 160 may be lowered more effectively.

The antenna 114 for wireless communication may transmit and receive various pieces of information to and from an electronic device through data communication when the electronic device is close thereto. The antenna 114 for wireless communication may be a near-field communication (NFC) antenna using a frequency of 13.56 MHz.

Figure 2:
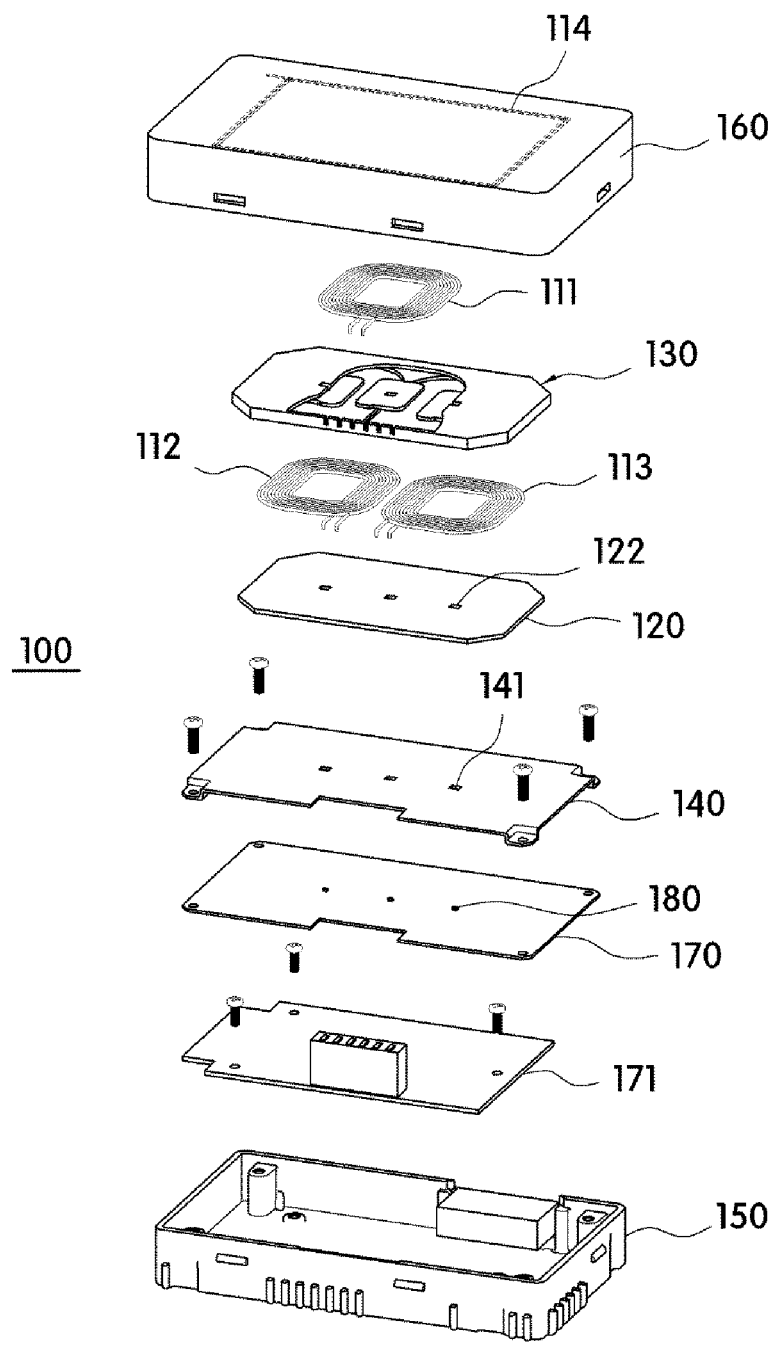
FIG. 2 is an exploded view of FIG. 1.
Figure 3:
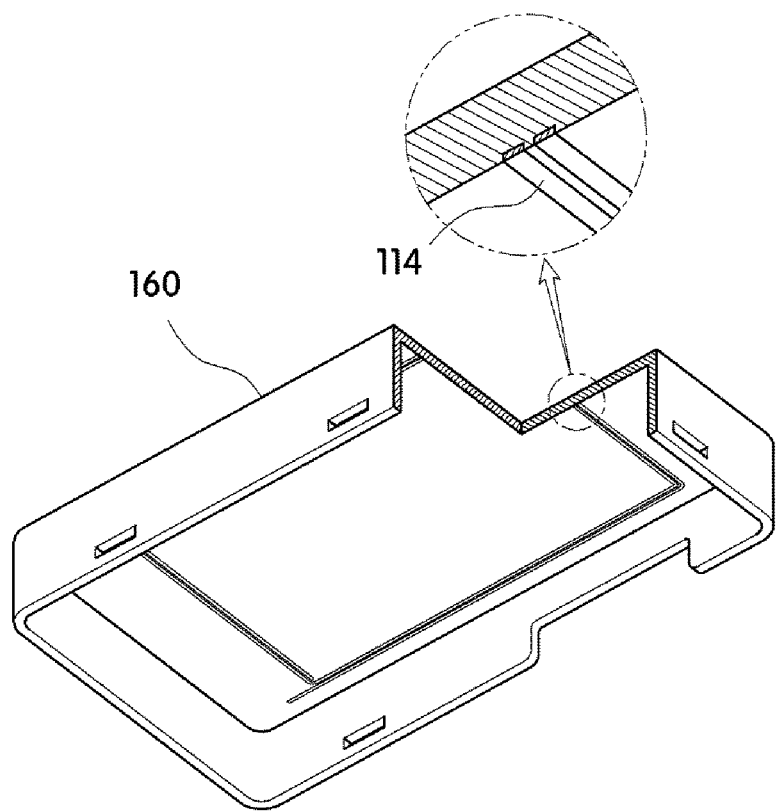
FIG. 3 is a view illustrating a state in which an antenna for wireless communication is embedded in a cover in FIG. 1.
Figure 4:
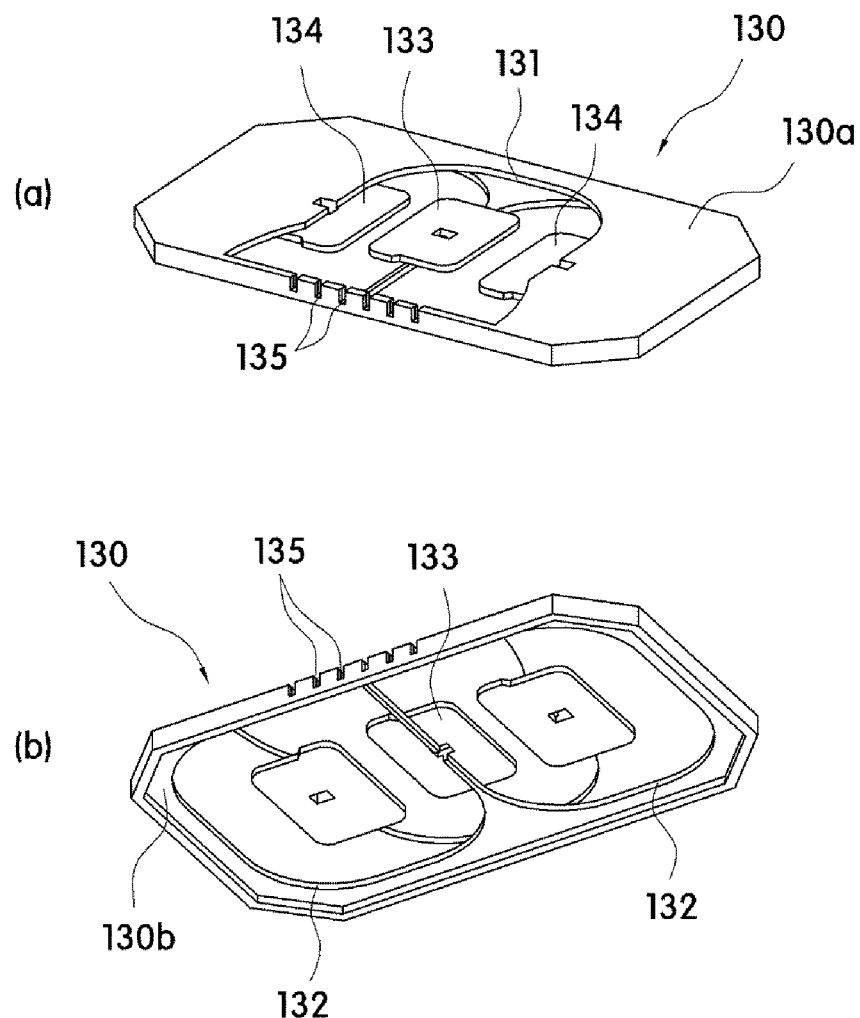
FIG. 4 illustrates views illustrating a support plate applicable to the wireless power transmission device of FIG. 1.
Figure 5:
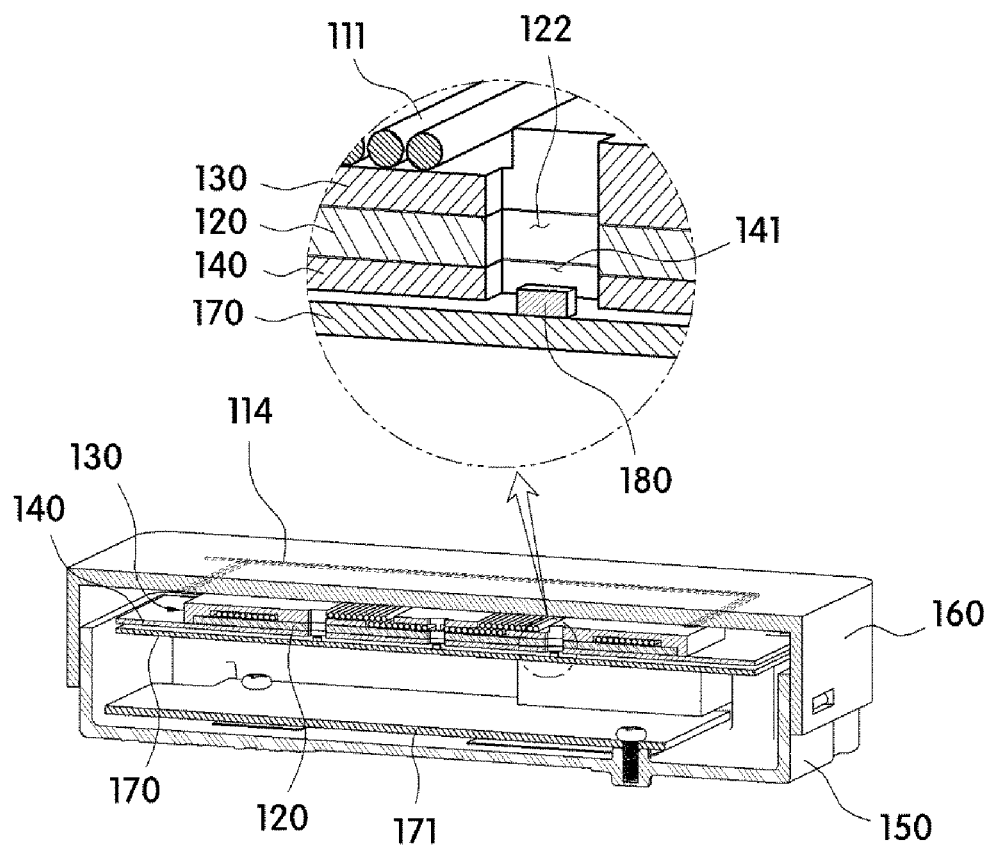
FIG. 5 is a longitudinal sectional view of FIG. 1.
Figure 6:
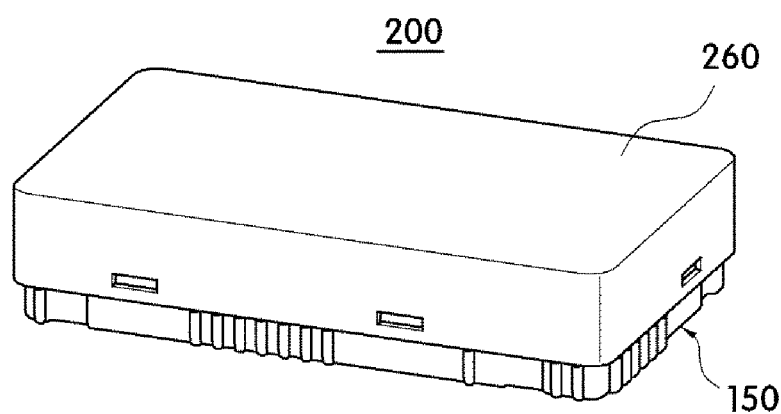
FIG. 6 is a view illustrating a wireless power transmission device according to another embodiment of the present invention.

In this case, in the wireless power transmission device 100 according to the embodiment of the present invention, the antenna 114 for wireless communication may be integrally formed with the cover 160 as illustrated in FIGS. 1 to 3.

Accordingly, in the wireless power transmission device 100 according to the embodiment of the present invention, in a case in which the electronic device is disposed on one surface of the cover 160, both of data communication and wireless power transmission may be performed at the same location even without changing a location of the electronic device.

That is, in the wireless power transmission device 100 according to the embodiment of the present invention, the antenna 114 for wireless communication may be integrally formed with the cover 160, and thus a distance between the antennas 111, 112, and 113 for wireless power transmission and an antenna for wireless power reception embedded in the electronic device may not be increased even when the electronic device is placed on one surface of the cover 160. As a result, degradation of wireless charging efficiency due to the increase in the distance between the antenna for wireless power transmission and the antenna for wireless power reception may be prevented.

In other words, in comparison to the case in which the antenna for wireless communication may be patterned on one surface of the circuit board and the circuit board is disposed between the antennas 111, 112, and 113 for wireless power transmission and the cover 160, in the wireless power transmission device 100 according to the embodiment of the present invention, since the antenna 114 for wireless communication is integrally formed with the cover 160, the use of a circuit board for forming the antenna for wireless communication may be omitted.

Accordingly, both of a data communication function and a wireless power transmission function may be implemented without increasing the total thickness of the wireless power transmission device 100, and the distance between the antennas 111, 112, and 113 for wireless power transmission and the cover 160 may be relatively reduced by a thickness of the omitted circuit board. Accordingly, it is possible to prevent degradation of charging efficiency due to an increase in distance during wireless charging using the antennas 111, 112, and 113 for wireless power transmission.

To this end, the antenna 114 for wireless communication may be formed on one surface of the cover 160 as illustrated in FIG. 3 and may be formed on an inner surface of the cover 160 so as to prevent external exposure.

As a specific example, the antenna 114 for wireless communication may be embedded in the inner surface of the cover 160 and may be a laser direct structuring (LDS) antenna using an LDS process. However, the method of forming the antenna 114 for wireless communication is not limited thereto, and the antenna 114 for wireless communication may be formed by attaching a copper foil or a metal foil having a predetermined pattern to one surface of the cover 160, may be formed by attaching a copper foil or a metal foil to the inner surface of the cover 160 and then etching, or may be formed by printing conductive ink in a predetermined pattern on the inner surface of the cover 160.

The antenna 114 for wireless communication may be electrically connected to the driving circuit board 170 on which a driving chip is mounted, and the driving of the antenna 114 for wireless communication may be controlled by the driving chip.

In this case, the antenna 114 for wireless communication may be disposed on the inner surface of the cover 160 so as not to overlap the antennas 111, 112, and 113 for wireless power transmission. For example, the antenna 114 for wireless communication may be formed to be located in the remaining regions except for direct upper portions of the antennas 111, 112, and 113 for wireless power transmission on the inner surface of the cover 160.

Accordingly, the wireless power transmission device 100 may prevent characteristic degradation that may occur when the antenna 114 for wireless communication is formed at a location overlapping the antennas 111, 112, and 113 for wireless power transmission. However, the location at which the antenna 114 for wireless communication is formed is not limited thereto, and the antenna 114 for wireless communication may be formed such that some or all of the antennas are located in the direct upper portions of the antennas 111, 112, and 113 for wireless power transmission.

Meanwhile, the wireless power transmission device 100 according to the embodiment of the present invention may further include a heat dissipation plate 140 to further increase heat dissipation performance.

That is, the heat dissipation plate 140 may be disposed to be in contact with one surface of the magnetic field shielding sheet 120 and may serve to disperse the heat transmitted from the heat source or emit the heat externally.

To this end, the heat dissipation plate 140 may be made of a material having high thermal conductivity. For example, the heat dissipation plate 140 may be made of any one of copper, aluminum, and graphite, or may be made of a mixture of two or more thereof. In addition, the heat dissipation plate 140 is not limited to the materials listed above but may be made of a material having a thermal conductivity of 200 W/m·K or more.

In this case, the heat dissipation plate 140 may be made of a plate type member having a predetermined area so as to widen a contact area with the heat source to rapidly disperse the heat generated from the heat source.

Preferably, the heat dissipation plate 140 may be a plate type metal plate such as copper or aluminum. Accordingly, the heat dissipation plate 140 may serve to disperse or emit the heat generated from the heat source such as the antennas 111, 112, and 113 for wireless power transmission, and at the same time, may serve as a support for supporting the magnetic field shielding sheet 120.

That is, even when the magnetic field shielding sheet 120 is formed in the form of a weak or flexible sheet such as a ferrite sheet or a polymer sheet, the magnetic field shielding sheet 120 may be supported by the heat dissipation plate 140 made of a metal material having a predetermined intensity. Accordingly, when being assembled with other parts such as a case, a housing, and the like, assembling and fastening may be improved.

The heat dissipation plate 140 may be attached to one surface of the magnetic field shielding sheet 120 through an adhesive layer (not illustrated) including a thermally conductive component.

Accordingly, the heat generated from the antennas 111, 112, and 113 for wireless power transmission may be transmitted to the heat dissipation plate 140 through the magnetic field shielding sheet 120 and then dispersed. A temperature of air present in an upper side of the antennas 111, 112, and 113 for wireless power transmission may be lowered.

Meanwhile, the magnetic field shielding sheet 120 and the heat dissipation plate 140 may include at least one through-hole 122 and at least one through-hole 141, which are formed to pass therethrough in a region corresponding to each other as illustrated in FIG. 2. That is, the magnetic field shielding sheet 120 may include at least one first through-hole 122 formed to pass therethrough and the heat dissipation plate 140 may include second through-holes 141 formed to pass therethrough at locations corresponding to those of the first through-holes 122.

When the driving circuit board 170 is disposed on a bottom surface of the heat dissipation plate 140, the first through-holes 122 and the second through-holes 141 may serve as paths through which air around the antennas 111, 112, and 113 for wireless power transmission moves toward the driving circuit board 170.

Here, the driving circuit board 170 may include temperature sensors 180 such as thermistors mounted at locations corresponding to those of the second through-holes 141. In this case, the second through-hole 141 may serve as an arrangement hole for accommodating a height of the temperature sensor 180 protruding from the driving circuit board 170 by a predetermined height.

In this case, since the second through-hole 141 may be formed to have a relatively wider area than a size of the temperature sensor, the second through-hole 141 may prevent the temperature sensor from being in direct contact with the heat dissipation plate 140.

Accordingly, the air, which exchanges heat with the heat generated from the antennas 111, 112, and 113 for wireless power transmission during the operation of the wireless power transmission device, may be introduced into the temperature sensors 180 through the first through-holes 122 and the second through-holes 141. The temperature sensors 180 may sense temperatures of the heat generated from the antennas 111, 112, and 113 for wireless power transmission using the introduced air.

As a result, when temperatures of the antennas 111, 112, and 113 for wireless power transmission are higher than a predetermined value, the entire operation may be stopped to prevent a problem such as damage to an electronic part due to overheating.

In this case, the first through-holes 122 may be formed to pass through the regions corresponding to hollow portions of the flat-plate type coils constituting the antennas 111, 112, and 113 for wireless power transmission. That is, the first through-holes 122 may be formed at locations that do not overlap a pattern portion of the flat-plate type coils. Accordingly, the air around the flat-plate type coils may be smoothly moved through the first through-holes 122.

Meanwhile, the wireless power transmission device 200 according to another embodiment of the present invention may include antennas 111, 112, and 113 for wireless power transmission, a support plate 230, and an antenna 114 for wireless communication as illustrated in FIGS. 6 to 12. The antenna 114 for wireless communication may be disposed on a side portion of the support plate 230.

The antennas 111, 112, and 113 for wireless power transmission may transmit wireless power to a wireless power reception module using an inductive coupling method based on electromagnetic induction or a magnetic resonance method. The antennas 111, 112, and 113 for wireless power transmission may be disposed on one surface of a magnetic field shielding sheet 120.

In the present embodiment, since roles, functions, and materials of the antennas 111, 112, and 113 for wireless power transmission and the magnetic field shielding sheet 120 are the same as in the above-described embodiment, detailed descriptions thereof will be omitted, and the contents mentioned in the above-described embodiment may be equally applied. However, in the present embodiment, the antennas 111, 112, and 113 for wireless power transmission may be configured as flat-plate type coils, and each of the antennas 111, 112, and 113 for wireless power transmission may be inserted into accommodation grooves 131 and 132 formed in the support plate 230.

That is, the support plate 230 may fix locations of the antennas 111, 112, and 113 for wireless power transmission formed as the flat-plate type coils. When the antennas 111, 112, and 113 for wireless power transmission are provided as a plurality of antennas, a plurality of accommodation grooves 131 and 132 and a plurality of ridge portions 133 and 134 may be formed in the support plate 230 like the support plate 130 in the above-described embodiment so that overlapping portions between the coils may overlap at desired locations and with desired areas.

Accordingly, in the wireless power transmission device 200 according to another embodiment of the present invention, like in the above-described embodiment, even when the support plate 230 for aligning the locations of the coils is used, a thickness of the wireless power transmission device 200 may not be increased, and the antennas 111, 112, and 113 for wireless power transmission formed as the plurality of flat-plate type coils may be easily aligned.

In addition, each of the coils 111, 112, and 113 accommodated in the accommodation grooves 131 and 132 may have one surface that forms a horizontal surface with one surface of the support plate 230, and thus a contact area with the magnetic field shielding sheet 120 may be increased. Accordingly, even when the magnetic field shielding sheet 120 is made of a material having flexibility or a material that has strong brittleness, an edge of the magnetic field shielding sheet 120 may be supported by the support plate 230. The magnetic field shielding sheet 120 may be prevented from being damaged by an external impact through the support plate 230 and may be disposed horizontally on one surface of the support plate 230.

In addition, the support plate 230 may serve to dispose the coils in an easily aligned state and to fix the locations of the coils and may include a heat dissipation function to address a thermal problem by rapidly dispersing heat generated from the coils.

In addition, the support plate 230 may serve to easily align arrangement of and to fix the locations of the coils and may include a heat dissipation function to address a thermal problem by rapidly dispersing heat generated from the coils.

In the present embodiment, the method of implementing the heat dissipation function of the support plate 130 in the above-described embodiment may be applied to a method of implementing a heat dissipation function of the support plate 230. Detailed contents thereof are the same as those described above, and thus will be omitted.

The antenna 114 for wireless communication may be formed by winding a conductive member having a predetermined length one or more times, and the antenna 114 may transmit and receive various pieces of information to and from an electronic device through data communication when the electronic device is close thereto. The antenna 114 for wireless communication may be an NFC antenna using a frequency of 13.56 MHz.

In this case, in the wireless power transmission device 200 according to another embodiment of the present invention, the antenna 114 for wireless communication may be disposed on the side portion of the support plate 230 as described above.

Accordingly, in the wireless power transmission device 200 according to another embodiment of the present invention, when the electronic device is disposed on one surface of the cover 260, both of data communication and wireless power transmission may be performed at the same location even without changing a location of the electronic device.

That is, in the wireless power transmission device 200 according to another embodiment of the present invention, the antenna 114 for wireless communication may be disposed on the side portion of the support plate 230, and thus a distance between the antennas 111, 112, and 113 for wireless power transmission and an antenna for wireless power reception embedded in the electronic device may not be increased even when the electronic device is placed on one surface of the cover 160. As a result, degradation of wireless charging efficiency due to the increase in the distance between the antenna for wireless power transmission and the antenna for wireless power reception may be prevented.

In other words, in comparison to the case in which the antenna for wireless communication may be patterned on one surface of the circuit board and the circuit board is disposed between the antennas 111, 112, and 113 for wireless power transmission and the cover 260, in the wireless power transmission device 100 according to the embodiment of the present invention, since the antenna 114 for wireless communication is disposed on the side portion of the support plated 230, the use of a circuit board for forming the antenna for wireless communication may be omitted.

Accordingly, both of a data communication function and a wireless power transmission function may be implemented without increasing a total thickness of the wireless power transmission device 200, and the distance between the antennas 111, 112, and 113 for wireless power transmission and the cover 260 may be relatively reduced by a thickness of the omitted circuit board. Accordingly, it is possible to prevent degradation of charging efficiency due to an increase in distance during wireless charging using the antennas 111, 112, and 113 for wireless power transmission.

Figure 7:
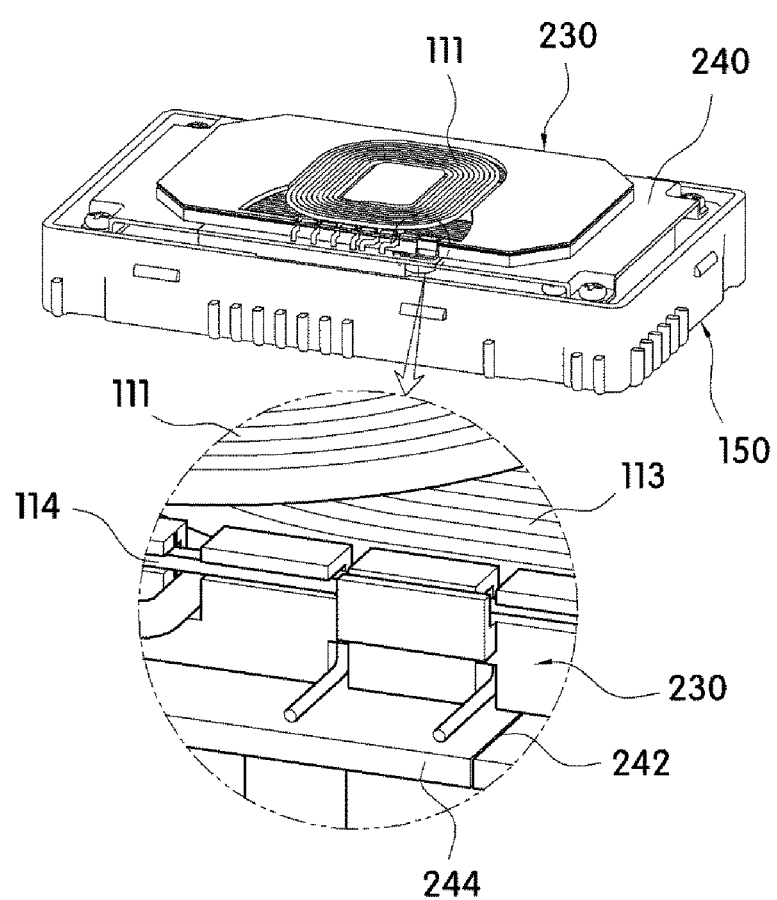
FIG. 7 is a view illustrating a state in which a cover is removed in FIG. 6.
Figure 9:
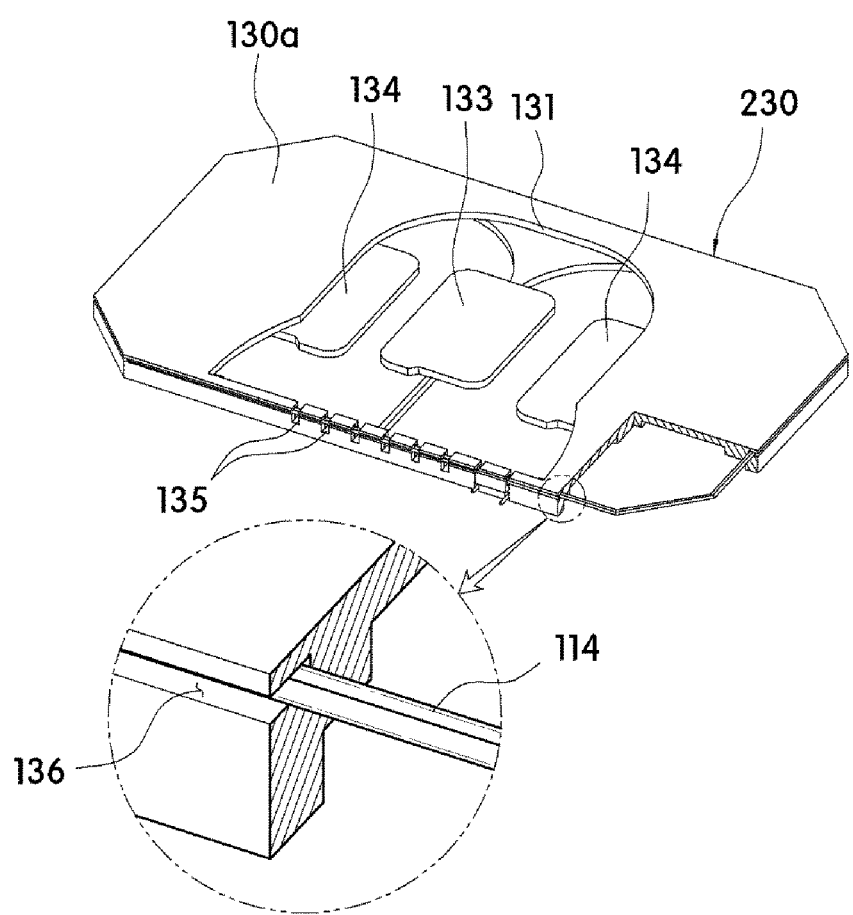
FIG. 9 is a partially cutaway view of a support plate applied to the wireless power transmission device of FIG. 6.
Figure 10:
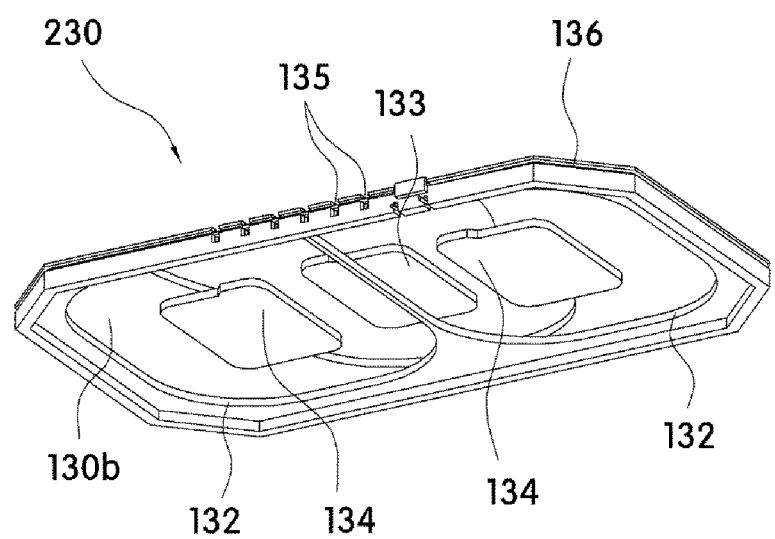
FIG. 10 is a view of FIG. 9 when viewed from the bottom.

To this end, the support plate 230 may include an arrangement groove 136 which is formed inwardly into the side portion thereof as illustrated in FIGS. 7 and 9, and the antenna 114 for wireless communication may be accommodated in the arrangement groove 136.

That is, the conductive member constituting the antenna 114 for wireless communication may be wound one or more times around the arrangement groove 136 formed in the side portion of the support plate 230.

In this case, a width of the arrangement groove 136 may be relatively greater than a wire diameter of the conductive member or may be identical to the wire diameter of the conductive member.

Accordingly, in a case in which the conductive member is wound a plurality of times around the arrangement groove 136, the conductive member constituting the antenna 114 for wireless communication may be prevented from being wound to overlap conductive members each other or being obliquely wound with respect to conductive members neighboring each other in the process of winding a plurality of times.

Accordingly, in order to configure the antenna 114 for wireless communication, the operation of winding the conductive member around the arrangement groove 136 may be smoothly performed, and property changes or performance degradation that may occur when adjacent conductive members are disposed to be inclined or to overlap each other may be prevented.

Meanwhile, the support plate 230 may include guide grooves 135 formed in at least one surface thereof as illustrated in FIG. 9. The guide grooves 135 may accommodate a pair of connection terminals 111a, 112a, and 113a provided in the antennas 111, 112, and 113 for wireless power transmission.

In this case, the guide grooves 135 may communicate with the accommodation grooves 131 and 132. Accordingly, the guide grooves 135 may appropriately dispose connection terminals of the antennas 111, 112, and 113 for wireless power transmission inserted into the accommodation grooves 131 and 132, and the connection terminals inserted into the accommodation grooves 131 and 132 may be easily connected to a circuit board 244.

Figure 11:
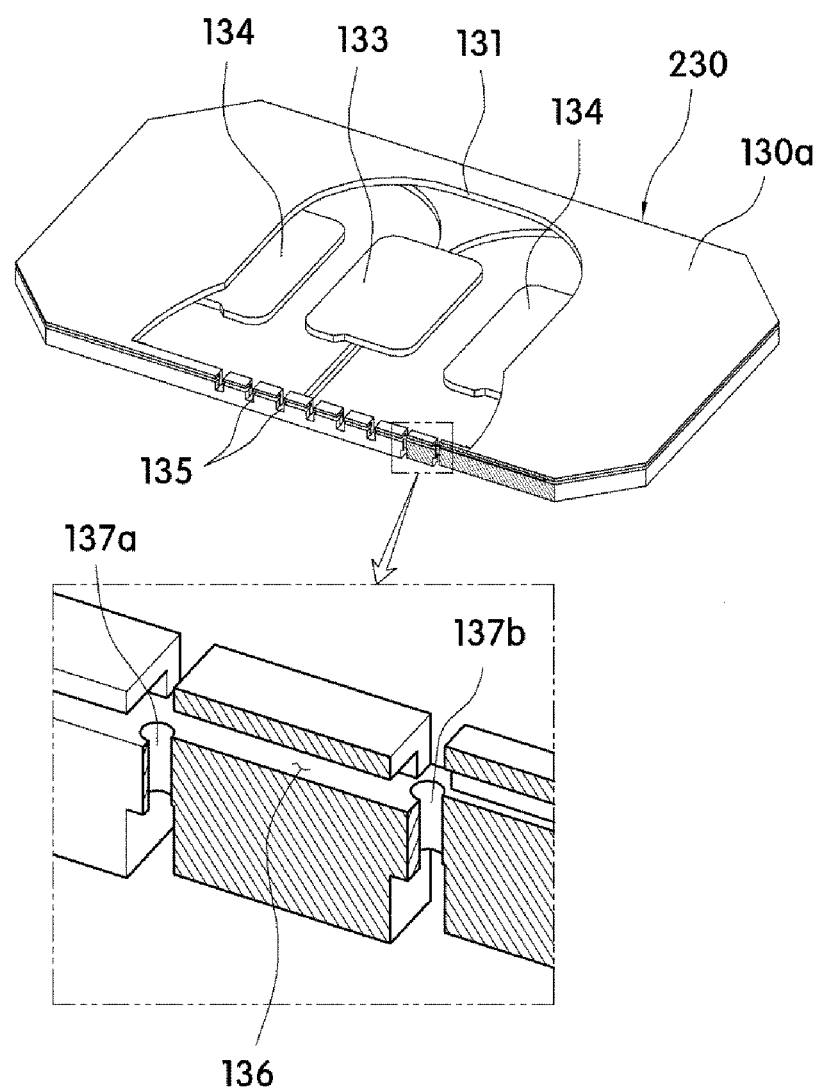
FIG. 11 is a partial cutaway view for describing locations at which through-holes are formed in a support plate applied to the wireless power transmission device of FIG. 6.
Figure 12:
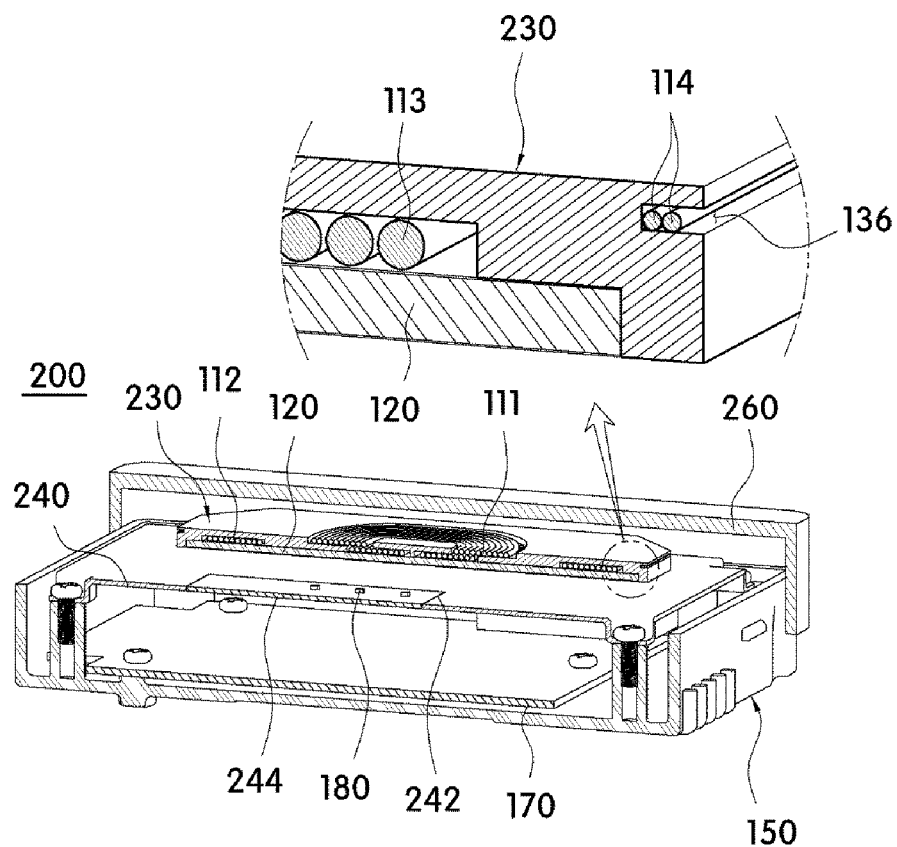
FIG. 12 is a longitudinal sectional view of FIG. 6.

Further, the support plate 230 may include two through-holes 137a and 137b formed to pass through the support plate 230 as illustrated in FIG. 11. Both ends of the conductive member constituting the antenna 114 for wireless communication may pass through the two through-holes 137a and 137b, respectively. Accordingly, as illustrated in FIG. 7, since the both ends of the conductive member pass through the two through-holes 137a and 137b, respectively, the conductive member may maintain a state of being wound around the arrangement groove 136 even when a separate adhesive is not used.

In this case, the two through-holes 137a and 137b may be formed to be staggered with respect to a straight line parallel to a longitudinal direction of the support plate 230. For example, as illustrated in FIG. 11, any one through-hole 137b of the two through-holes 137a and 137b may be formed to be relatively located at an inner side of the support plates 130 and 230 and the other through-hole 137a may be formed to be relatively located at an edge side of the support plate 230.

Accordingly, when the conductive member constituting the antenna 114 for wireless communication is wound a plurality of times around the arrangement groove 136, the both ends of the conductive member may smoothly pass through the two through-holes 137a and 137b, respectively, even when the width of the arrangement groove 136 is identical to the wire diameter of the conductive member.

Specifically, one end of the conductive member constituting the antenna 114 for wireless communication may pass through the through-hole 137b relatively located at the inner side of the support plate 230, may be wound in a clockwise or counterclockwise direction around the arrangement groove 136, and then may pass through the through-hole 137a relatively located at the edge of the support plate 230. Accordingly, a middle length of conductive members adjacent to each other may be arranged in parallel in a width direction of the arrangement groove 136 without overlapping each other.

Meanwhile, the wireless power transmission device 200 according to another embodiment of the present invention may further include a heat dissipation plate 240 to further increase heat dissipation performance.

That is, the heat dissipation plate 240 may be disposed to be in contact with one surface of the magnetic field shielding sheet 120 and may serve to disperse the heat transmitted from the heat source or emit the heat externally.

To this end, the heat dissipation plate 240 may be made of a material having high thermal conductivity. For example, the heat dissipation plate 240 may be made of any one of copper, aluminum, and graphite, or may be made of a mixture of two or more thereof. In addition, the heat dissipation plate 240 is not limited to those listed above but may be made of a material having a thermal conductivity of 200 W/m·K or more.

In this case, the heat dissipation plate 240 may be made of a plate type member having a predetermined area so as to widen a contact area with the heat source to rapidly disperse the heat generated from the heat source.

Preferably, the heat dissipation plate 240 may be a plate type metal plate such as copper or aluminum. Accordingly, the heat dissipation plate 240 may serve to disperse or emit the heat generated from the heat source such as the antennas 111, 112, and 113 for wireless power transmission and, at the same time, may serve as a support for supporting the magnetic field shielding sheet 120.

That is, even when the magnetic field shielding sheet 120 is formed in the form of a weak or flexible sheet form such as a ferrite sheet or a polymer sheet, the magnetic field shielding sheet 120 may be supported by the heat dissipation plate 240 made of a metal material having a predetermined intensity. Accordingly, when being assembled with other parts such as a case, a housing, and the like, assembling and fastening may be improved.

The heat dissipation plate 240 may be attached to one surface of the magnetic field shielding sheet 120 through an adhesive layer (not illustrated) including a thermally conductive component.

Accordingly, the heat generated from the antennas 111, 112, and 113 for wireless power transmission may be transmitted to the heat dissipation plate 240 through the magnetic field shielding sheet 120 and then dispersed. A temperature of air present in an upper side of the antennas 111, 112, and 113 for wireless power transmission may be lowered.

In this case, a cut portion 242, which is introduced into one side of the heat dissipation plate 240 to have a predetermined area, may be formed on the heat dissipation plate 240, and the circuit board 244, which is electrically connected to the antennas 111, 112, and 113 for wireless power transmission and the antenna 114 for wireless communication, may be disposed on the cut portion 242.

Accordingly, a pair of connection terminals 111a, 112a, and 113a provided at both ends of the antennas 111, 112, and 113 for wireless power transmission may be inserted into the guide groove 135 formed in the support plate 230 and then end portions of the connection terminals 111a, 112a, and 113a may be connected to the circuit board 244. Further, both ends of the conductive member constituting the antenna 114 for wireless communication may pass through two through-holes 137a and 137b and then may be connected to the circuit board 244.

Here, in the wireless power transmission device 200 according to the present embodiment, temperature sensors 180 such as thermistors may be mounted on one surface of the circuit board 244 as illustrated in FIG. 9. In this case, the magnetic field shielding sheet 120 may include through-holes 122 formed to pass through regions corresponding to the temperature sensors 180. Accordingly, the through-hole 122 may accommodate a height of the temperature sensor 180 protruding from the circuit board 244 even when the temperature sensor 180 protrudes from the circuit board 244 by a predetermined height.

Accordingly, the air, which exchanges heat with the heat generated from the antennas 111, 112, and 113 for wireless power transmission during the operation of the wireless power transmission device, may be introduced into the temperature sensors 180 through the through-holes 122. The temperature sensors 180 may sense temperatures of the heat generated from the antennas 111, 112, and 113 for wireless power transmission using the introduced air.

As a result, when the temperatures of the antennas 111, 112, and 113 for wireless power transmission are higher than a predetermined value, the entire operation may be stopped to prevent a problem such as damage to an electronic part due to overheating.

Meanwhile, the wireless power transmission device 200 according to another embodiment of the present invention may include a housing 150 and a cover 260 detachably coupled to the housing 150.

Specifically, the housing 150 may be provided in a housing shape having an accommodation space of which an upper portion is open, and at least one driving circuit board 170 may be accommodated in the accommodation space.

In this case, the at least one driving circuit board 170 may be electrically connected to the antennas 111, 112, and 113 for wireless power transmission and the antenna 114 for wireless communication and may control overall driving of the wireless power transmission device 200.

To this end, in the driving circuit board 170, various circuit elements for controlling the overall driving of the wireless power transmission device may be mounted and driving chips for driving the antenna 114 for wireless communication and the antennas 111, 112, and 113 for wireless power transmission may be mounted. In addition, the circuit elements may be provided as a plurality of circuit elements or may be provided in one integrated form.

The housing 150 may be made of a typical plastic material but may have heat dissipating properties so as to discharge heat generated from a heat source to the outside during driving.

For example, the housing 150 may be made of a metal material such as copper or aluminum, may be made of a heat dissipation plastic material, or may be provided in a form in which a metal plate and heat dissipation plastic are integrated. In addition, in order to implement more excellent heat dissipating properties, a heat dissipation coating layer (not illustrated) may be formed on a surface of the housing 150.

Accordingly, the heat generated from the heat source may be emitted through the housing 150. Accordingly, the cover 260 on which an electronic device, which is a charging target, is placed may have a low surface temperature.

That is, the wireless power transmission device 200 according to another embodiment of the present invention may rapidly emit the heat generated from the heat source through the housing 150 even though the cover 260 is heated by the heat generated from the heat source and thus may prevent the surface temperature of the cover 260 from increasing. Accordingly, even when the user's body comes into contact with the cover 160 during the operation of the wireless power transmission device 200, the user may not feel an unpleasant feeling due to a high temperature.

As a non-limiting example, any known coating layer having heat dissipating properties may be applied to the heat dissipation coating layer, but the heat dissipation coating layer may include a coating layer forming component, a carbon-based filler, and a property enhancing component for improving heat dissipating properties and adhesion. Further, the heat dissipation plastic may be made of a heat dissipation member forming composition including a graphite composite and a polymer resin and may be implemented in the form of the housing 150 through curing after insert injection molding. Here, the graphite composite may be a composite in which nanometal particles are bonded to a surface of a plate type graphite, and the heat dissipation member forming composition may be a composition in which the graphite composite is dispersed in a polymer resin. In addition, although not specifically described, the cover 260 may also be made of the same material as the housing 150 described above. When the cover 260 has heat dissipating properties, the surface temperature of the cover 260 may be lowered more effectively.

Although the embodiments of the present invention have been described above, the spirit of the present invention is not limited to the embodiments set forth herein, and those skilled in the art who understand the spirit of the present invention may easily propose other embodiments by adding, changing, deleting, adding, etc., within the scope of the same idea, but this will also fall within the spirit of the present invention.

The invention claimed is:

1. A wireless power transmission device comprising:
at least one antenna for wireless power transmission disposed on one surface of a magnetic field shielding sheet;
a support plate having at least one accommodation groove for accommodating the antenna for wireless power transmission; and
an antenna for wireless communication disposed along a side surface of the support plate,
wherein the support plate includes an arrangement groove which is formed inwardly into the side surface thereof so as to accommodate the antenna for wireless communication,
wherein the antenna for wireless communication is a conductive member wound a predetermined number of turns around the arrangement groove,
wherein the support plate includes two through-holes formed to allow both ends of the antenna for wireless communication to pass therethrough,
wherein the two through-holes are respectively formed at positions staggered from each other so that one of the through-holes is positioned inside of the support plate relative to the other one of the through-holes, and
wherein the two through holes are arranged such that at least a part thereof intersects the arrangement groove.

2. The wireless power transmission device of claim 1, wherein a width of the arrangement groove is identical to a wire diameter of the conductive member.

3. The wireless power transmission device of claim 1, further comprising a heat dissipation plate disposed on one surface of the magnetic field shielding sheet.

4. The wireless power transmission device of claim 3, wherein the heat dissipation plate is any one of a copper plate, an aluminum plate, and a graphite sheet.

5. The wireless power transmission device of claim 3, further comprising a circuit board electrically connected to the at least one antenna for wireless power transmission and the antenna for wireless communication,
wherein:
the heat dissipation plate includes a cut portion formed inwardly into one side thereof to have a predetermined area; and
the circuit board is disposed on the cut portion.

6. The wireless power transmission device of claim 5, further comprising at least one temperature sensor mounted on one surface of the circuit board,
wherein the magnetic field shielding sheet includes a through-hole formed to pass therethrough in a region corresponding to the temperature sensor.

7. The wireless power transmission device of claim 1, wherein:
the support plate includes a plurality of accommodation grooves formed in each of a first surface and a second surface which are opposite to each other;

the at least one antenna for wireless power transmission is composed of a plurality of flat-plate type coils;

any one of the plurality of flat-plate type coils is disposed in a first accommodation groove formed in the first surface; and the other one is disposed in a second accommodation groove formed in the second surface.

8. The wireless power transmission device of claim 7, wherein the support plate is made of a plastic material having heat dissipating properties.

\* \* \* \* \*